United States Patent [19]

Minami

[11] 4,068,136
[45] Jan. 10, 1978

[54] ANALOG VOLTAGE MEMORY DEVICE

[75] Inventor: Shunji Minami, Katano, Japan

[73] Assignee: Matsushita Electric Industrial Co., Ltd., Japan

[21] Appl. No.: 732,121

[22] Filed: Oct. 13, 1976

[30] Foreign Application Priority Data

Oct. 13, 1975 Japan .............................. 50-123556
Dec. 26, 1975 Japan .............................. 50-159389

[51] Int. Cl.² .......................................... G11C 27/02
[52] U.S. Cl. ................................. 307/353; 307/229; 307/238; 307/246; 328/151
[58] Field of Search ............... 307/238, 246, 229, 353; 328/151

[56] References Cited

U.S. PATENT DOCUMENTS

| | | | |
|---|---|---|---|
| 3,701,909 | 10/1972 | Holmes et al. | 307/238 X |
| 3,927,374 | 12/1975 | Nakaya | 328/151 |
| 3,996,480 | 12/1976 | Hentschel | 328/151 X |

*Primary Examiner*—John S. Heyman
*Attorney, Agent, or Firm*—Burgess, Ryan and Wayne

[57] ABSTRACT

Disclosed is an analog voltage memory device comprising a differential amplifier for deriving the difference between two analog inputs, an operational amplifier to which are applied the output of the differential amplifier and the source follower voltage of a MOS type field-effect transistor, switching means interconnected to the output terminal of the operational amplifier and the gate of the field-effect transistor, an output resistor interconnected between the source of the field-effect transistor and a negative power source or ground, and a nonpolarized capacitor interconnected between the gate of the field-effect transistor and a negative power source or ground, whereby the output voltage from the differential amplifier may be derived as the output voltage which is the source follower voltage of the field-effect transistor and is held. The analog voltage memory device may derive and hold the difference between two arbitrary analog inputs for a long time in a very simple manner and therefore has a dual function as an adder or subtractor and as an analog memory and finds very useful and wide applications in the fields of measuring instruments and medical appliances.

7 Claims, 6 Drawing Figures

ANALOG VOLTAGE MEMORY DEVICE

BACKGROUND AND SUMMARY OF THE INVENTION:

The present invention relates to an analog voltage memory device capable of holding the difference between or sum of two analog input voltages.

There have been devised and demonstrated various types of analog voltage memory devices capable of obtaining the correct difference between or the sum of two analog input voltages and holding the result for a long time, but so far they have been unsatisfactory in practice because their circuits are complex and operations are not reliable.

In view of the above, one of the objects of the present invention is to provide an analog voltage memory device which may derive the correct difference or the sum of two analog input voltages at an arbitary time and hold the result precisely for a considerably long time and is very simple in construction, inexpensive to manufacture and highly reliable in operation.

Briefly stated, to the above and other ends the present invention provides an analog voltage memory device comprising a differential amplifier for deriving the difference between two analog inputs, an operational amplifier having a noninverting input end connected to the output end of said differential amplifier, analog switching means having one end connected to the output circuit of said operational amplifier, a MOS type field-effect transistor having the gate connected to the other end of said analog switching means and the source connected to a noninverting input end of said operational amplifier, a nonpolarized capacitor interconnected between the gate of said MOS field-effect transistor and a negative power source or ground, and an output resistor interconnected between the source of said MOS field-effect transistor and said negative power source or ground, whereby the output of the differential amplifier may be derived as a source follower voltage of the field-effect transistor and held for a considerably long time.

According to the present invention, the sum of or difference between two analog inputs may be derived by a circuit which is very simple in construction and is held precisely for a considerably long time. Therefore an analog voltage memory device in accord with the present invention may be advantageously used in conjunction with a measurement instrument for sampling the sum of or difference between two analog inputs thereto and holding the result. In addition, the present invention finds wide applications in medical appliances.

The above and other objects, features and advantages of the present invention will become more apparent from the description of three preferred embodiments thereof taken in conjunction with the accompanying drawings.

Figure 1:
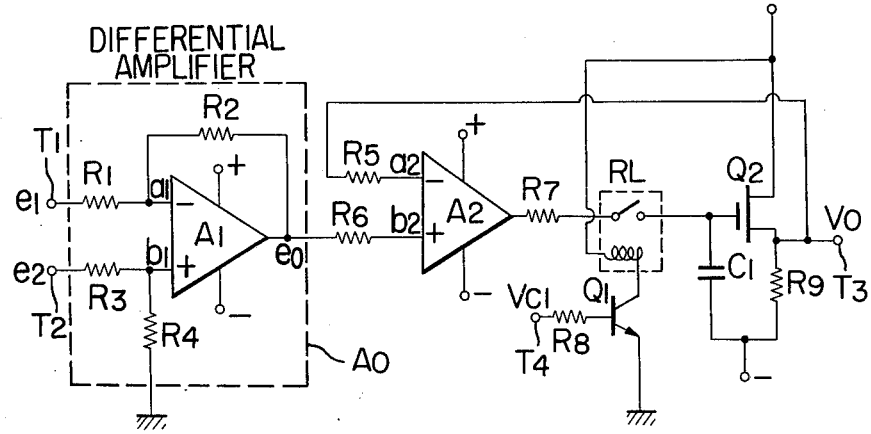
FIG. 1 is a circuit diagram of a first embodiment of an analog voltage memory device in accordance with the present invention.
Figure 2:
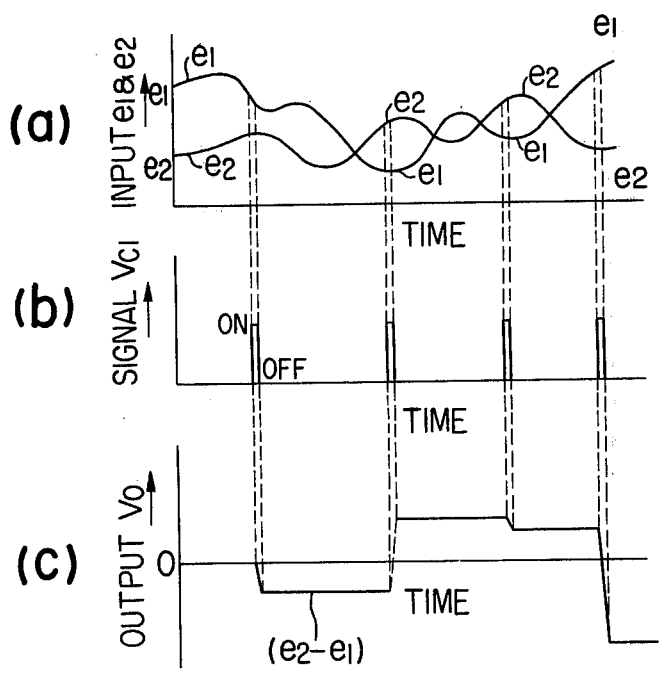
FIG. 2 shows waveforms of two input voltages, control signal and output voltage thereof.

DESCRIPTION OF THE PREFERRED EMBODIMENTS:

First Embodiment, FIGS. 1 and 2

In FIG. 1 there is shown a first embodiment of the present invention which has an operational aplifier $A_1$ with an inverting input end $a_1$ and a noninverting input end $b_1$ connected to input terminals $T_1$ and $T_2$ through resistors $R_1$ and $R_2$, respectively, to which are applied inputs $e_1$ and $e_2$, respectively. The inverting input end $a_1$ is connected to the output of the operational amplifier $A_1$ through a resistor $R_2$, and the noninverting input end $b_1$ is grounded through a resistor $R_4$. Thus the operational amplifier $A_1$ and the resistors $R_1$ to $R_4$ constitute a differential amplifier $A_0$ with a unit gain.

The output of the operational amplifier $A_1$ is connected to a noninverting input end $b_2$ of a second operational amplifier $A_2$ through a resistor $R_6$, and the output thereof is connected to the gate of a MOS type field-effect transistor $Q_2$ (to be referred to as "FET" hereinafter in this specification) through a resistor $R_7$ and a reed relay RL. The source of FET $Q_2$ is connected through a resistor $R_5$ to an inverting input end of the second operational amplifier $A_2$, to an input terminal $T_3$ from which output $V_0$ is derived and to one end of an output resistor $R_9$. The gate of FET $Q_2$ is connected to one terminal of a nonpolarized capacitor $C_1$ of which the other terminal is connected together with the other end of the output resistor $R_9$ to a negative power source (−). The drain of FET $Q_2$ is connected to a positive power source (+) and to one end of a coil of the reed relay RL, and the other end thereof is connected to the collector of a switching transistor $Q_1$. The base thereof is connected to a control terminal $T_4$ through a resistor $R_8$ while the emitter is grounded.

The positive power source (+) is also connected to the positive ends of the first and second operational amplifiers $A_1$ and $A_2$ and one end of the capacitor $C_1$ through the reed relay RL while the negative power source (−) is connected to the negative ends of the first and second operational amplifiers $A_1$ and $A_2$.

Next the mode of operation of the first embodiment with above construction will be described with further reference to FIG. 2. When the two inputs $e_1$ and $e_2$ as shown in FIG. 2(a) are applied to the first operational amplifier $A_1$, the putput $e_0$ expressed below is derived:

$$e_O = \left(\frac{R_1 + R_2}{R_3 + R_4}\right)\frac{R_4}{R_1} \cdot e_2 - \frac{R_2}{R_1} \cdot e_1$$

When
$R_1 = R_2 = R_3 = R_4,$
$e_0 = e_2 - e_1$

The output from the first amplifier $A_1$ is therefore the difference between two inputs.

When the control signal $V_{c1}$ as shown in FIG. 2(b) is applied to the control terminal $T_4$, current flows through the resistor $R_8$ so that the switching transistor $Q_1$ is turned on and consequently the coil of the reed relay RL is energized to close the reed. When $V_0 > e_0$, the output of the second operational amplifier $A_2$ is negative, and the capacitor $C_1$ is discharged through the resistor $R_7$. As a result, the drain current to FET $Q_2$ decreases with decrease in voltage across the capacitor $C_1$ and consequently the output voltage $V_0$ across the output resistor $R_9$ decreases and finally equals to $e_0$. Then the output from the second operational amplifier $A_2$ is balanced and the discharge of the capacitor $C_1$ is interrupted.

When the control signal $V_{c1}$ is removed, the reed relay RL is turned off so that the voltage across the capacitor $C_1$ remains unchanged. Thus during the control signal $V_{c1}$ is being applied, the output voltage $V_0$ becomes equal to $e_0$ ($V_0 = e_0$) to hold the voltage difference between the two inputs $e_1$ and $e_2$.

When $e_0 > V_0$ and when the control signal $V_{c1}$ is applied to the control terminal $T_4$, the output of the second operational amplifier $A_2$ is positive, and the reed relay RL is closed in the manner described above so that the charging of the capacitor $C_1$ is started, increasing the voltage thereacross until the source-follower voltage or output voltage $V_0$ becomes equal to $e_0$. Then the second operational amplifier $A_2$ is set to the equilibrium state, and even when the contrl signal $V_{c1}$ is removed, the output voltage $V_0$ remains equal to $e_0$ as shown in FIG. 2(c).

From the above description, it is seen that with a sufficiently small time constant of a circuit consisting of the resistor $R_7$ and the capacitor $C_1$, the analog operation or computation for obtaining $V_0 = e_2 - e_1$ may be much simplified. In like manner, analog addition and memory may be effected when the input $e_1$ is inverted to $-e_1$ and applied to the inverting input end $a_1$ of the first operational amplifier $A_1$.

Figure 3:
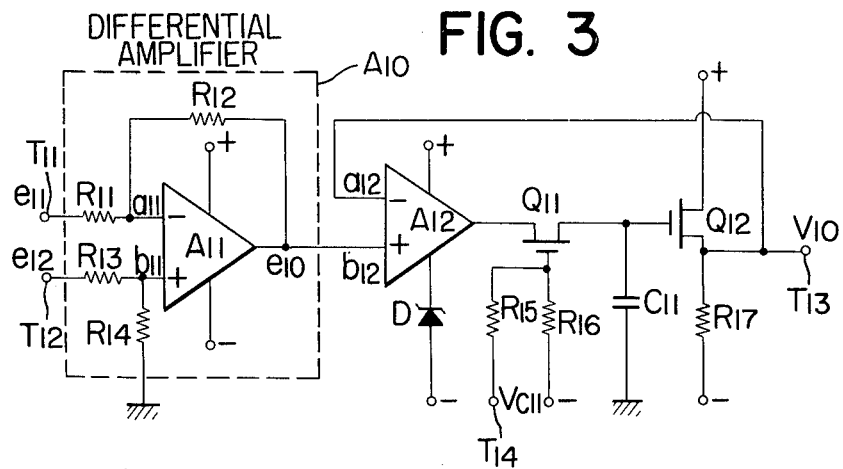
FIG. 3 is a circuit diagram of a second embodiment of the present invention.
Figure 4:
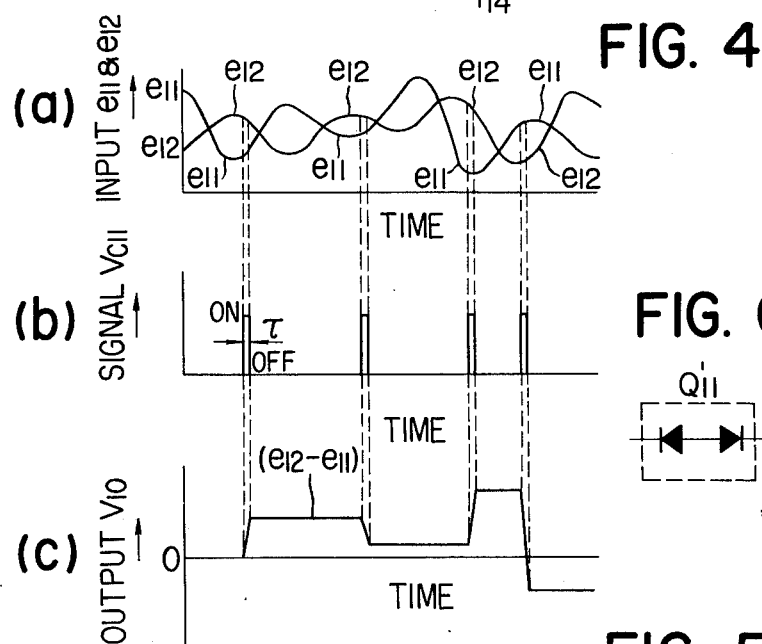
FIG. 4 shows waveforms of two input voltages, control signal and output voltage thereof.

Second Embodiment, FIGS. 3 and 4

In FIG. 3 there is shown a second embodiment of the present invention wherein a differential amplifier $A_{10}$ with unity gain comprises a first operational amplifier $A_{11}$ and resistors $R_{11}$ to $R_{14}$, and inputs $e_{11}$ and $e_{12}$ are applied to an inverting input end $a_{11}$ and a noninverting end $b_{11}$, respectively. The output of the first operational amplifier $A_{11}$ is connected to a noninverting input end $b_{12}$ of a second operational amplifier $A_{12}$ of which negative terminal is connected to a negative power supply $(-)$ through a zener diode D. The output of the second operational amplifier $A_{12}$ is connected to the drain of a First FET $Q_{11}$ with the source connected to the gate of a second FET $Q_{12}$. A nonpolarized capacitor $C_{11}$ is interconnected between the gate of the second FET $Q_{12}$ and ground, and the source of the second FET $Q_{12}$ is connected to the negative power source through a resistor $R_{17}$, to an output terminal $T_{13}$ and to an inverting end $a_{12}$ of the second operational amplifier $A_{12}$. The gate of the first FET $Q_{11}$ is connected to the negative power supply through a resistor $R_{16}$ and to a control terminal $T_{14}$ through a resistor $R_{15}$. The positive ends of the first and second operational amplifiers $A_{11}$ and $A_{12}$ and the drain of the second FET $Q_{12}$ are connected to a positive power source $(+)$, and the negative ends of the first operational amplifier $A_{11}$ is connected to the negative power source $(-)$. Thus, the source follower voltage of the second FET $Q_{12}$ is derived as the output voltage $V_{10}$ across the output resistor $R_{17}$.

Next the mode of operation will be described with further reference to FIG. 4. When the control signal $V_{c11}$ as shown in FIG. 4(b) is applied to the control terminal $T_{14}$ and hence to the gate of the first FET $Q_{11}$ and two inputs $e_{11}$ and $e_{12}$ are applied to the inverting end $a_{11}$ and the noninverting end $b_{11}$, respectively, of the first operational amplifier $A_{11}$ as shown in FIG. 4(a), the first FET $Q_{11}$ is kept on for a period equal to the pulse width $\tau$ of the control signal $V_{c11}$ [See FIG. 4(b)]. (The resistor $R_{15}$ has a value considerably smaller than the resistor $R_{16}$; that is, $R_{15} << R_{16}$.) Then the output $e_{10}$ of the differential amplifier $A_{11}$ comprising the first operational amplifier $A_{11}$ and resistors $R_{11}$ to $R_{14}$ is expressed by $$e_{10} = e_{12} - e_{11}$$

When $e_{10} > V_{10}$, the output of the operational amplifier $A_{12}$ is positive, the capacitor $C_{11}$ is charged through an internal resistance $r$ of the first FET $Q_{11}$. Then, by the action of the second operational amplifier $A_{12}$, the output of the second FET $Q_{12}$ increases until $$V_{10} = e_{10}$$

With the disappearance of the control signal $V_{c11}$, the first FET $Q_{11}$ is turned off and the voltage per se across the capacitor $C_{11}$ is maintained so that the relation $V_{10} = e_{10}$ is held.

When the next control signal $V_{c11}$ is applied to the control terminal $T_{14}$, the similar operation is cycled so that the analog voltage memory device holds the output voltage which is equal to $e_{10}' = e_{12}' - e_{11}'$. Thus, the output voltage $V_{10}$ varies in time as shown in FIG. 4(c).

Figure 6:
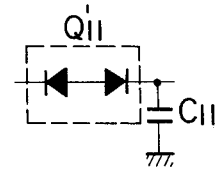
FIG. 6 is a schematic view illustrating a MOS FET assembly used in the third embodiment shown in FIG. 5.
Figure 5:
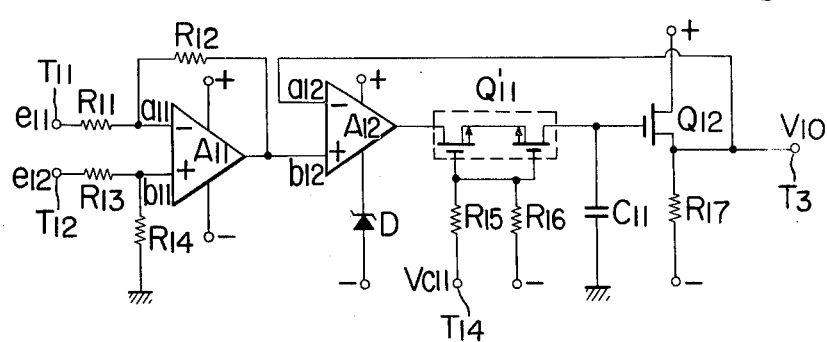
FIG. 5 is a circuit diagram of a third embodiment of the present invention.

Third Embodiment, FIGS. 5 and 6

The third embodiment of the present invention shown in FIG. 5 is substantially similar in construction to the second embodiment shown in FIG. 3 except that instead of the first FET $Q_{11}$ two FETs are used. More particularly, an FET assembly $Q_{11}'$ consists of two FETs whose gates and sources are physically joined together and whose sources are electrically interconnected so that the off state of the FET assembly $Q_{11}'$ is equivalent to the state provided by two diodes connected in back-to-back relation as shown in FIG. 6. Therefore the FET assembly $Q_{11}'$ functions as a switch with a considerably higher degree of isolation. The mode of operation of the third embodiment is substantially similar to that of the second embodiment.

Both the second and third embodiments function as an analog adder-memory respectively, as with the case of the first embodiment.

In the first embodiment the other terminal of the capacitor $C_1$ is connected to the negative power source while in the second and third embodiments the capacitor $C_{11}$ is grounded at the other terminal, but their functions are substantially similar except difference of reference voltage level for the capacitor $C_1$. The choice is dependent upon whether the negative source follower output, which is held as the output voltage, is required or not.

When either of the inputs $e_1$ or $e_2$ or $e_{11}$ or $e_{12}$ to the differential amplifier $A_0$ or $A_{10}$ is selected as a reference voltage, the present invention may be very advantageously used in conjunction with an instrument for measuring contents of toxic gases in the atmosphere, liquid level or blood pressure.

What is claimed is:
1. An analog voltage memory device, comprising:
   a differential amplifier for deriving the difference between two analog inputs;

an operational amplifier having a noninverting input end connected to the output of said differential amplifier;

analog switching means having one end connected to the output circuit of said operational amplifier;

a MOS type field-effect transistor having the gate connected to the other end of said analog switching means and the source connected to the inverting input end of said operational amplifier;

means for connecting the source and drain electrodes of said transistor to respective negative and positive terminals of a source of potential difference;

a nonpolarized capacitor interconnected between the gate of said MOS field-effect transistor and said negative terminal; and an output resistor interconnected between the source of said MOS field-effect transistor and said negative terminal.

2. An analog voltage memory device according to claim 1 wherein said analog switching means comprises a reed relay.

3. An analog voltage memory device according to claim 1 wherein said analog switching means comprises a second MOS field-effect transistor, said operational amplifier has positive and negative power supply terminals, and a zener diode is interconnected between said negative terminal of said source of potential difference and said negative supply terminal of said operational amplifier.

4. An analog voltage memory device according to claim 2 wherein an input resistor is interconnected between the output end of said operational amplifier and a terminal of said reed relay opposite to the terminal thereof connected to the gate of said MOS type field-effect transistor, said reed relay having an actuating coil, a switching transistor coupling one end of said coil to a control terminal, and means for applying a control signal to said control terminal.

5. An analog voltage memory device according to claim 3, further comprising first and second biasing resistors, wherein the gate of said second MOS type field-effect transistor is connected to said negative terminal of said source of potential difference through said first resistor and through said second resistor to a control terminal, and means for applying a control signal to said control terminal.

6. An analog voltage memory device according to claim 1 wherein said analog switching means comprises two MOS field-effect transistors whose gates and sources are electrically interconnected, said operational amplifier has positive and negative power supply terminals, and further comprising a zener diode interconnected between said negative terminal of said source of potential difference and said negative supply terminal of said operational amplifier.

7. An analog voltage memory device as set forth in claim 6 wherein the gates of said two MOS field-effect transistors are connected to said negative terminal of said source of potential difference, further comprising a first resistor and a second resistor for coupling said gates to a control terminal, and means for applying a control signal to said control terminal.

* * * * *

UNITED STATES PATENT OFFICE
CERTIFICATE OF CORRECTION

Patent No. 4,068,136  Dated January 10, 1978

Inventor(s) Shunji Minami

It is certified that error appears in the above-identified patent and that said Letters Patent are hereby corrected as shown below:

Column 2, line 11: "aplifier" should be --amplifier--.

line 52: "putput" should be --output--.

Column 3, line 22: "contrl" should be --control--.

Signed and Sealed this

Thirteenth Day of June 1978

[SEAL]

Attest:

RUTH C. MASON
Attesting Officer

DONALD W. BANNER
Commissioner of Patents and Trademarks